(12) United States Patent
Zhuang

(10) Patent No.: US 10,274,848 B2
(45) Date of Patent: Apr. 30, 2019

(54) AMPLITUDE MONITORING SYSTEM, FOCUSING AND LEVELING DEVICE, AND DEFOCUSING AMOUNT DETECTION METHOD

(71) Applicant: SHANGHAI MICRO ELECTRONICS EQUIPMENT (GROUP) CO., LTD., Shanghai (CN)

(72) Inventor: Yazheng Zhuang, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 28 days.

(21) Appl. No.: 15/531,225

(22) PCT Filed: Nov. 26, 2015

(86) PCT No.: PCT/CN2015/095627
§ 371 (c)(1),
(2) Date: May 26, 2017

(87) PCT Pub. No.: WO2016/082772
PCT Pub. Date: Jun. 2, 2016

(65) Prior Publication Data
US 2017/0329242 A1 Nov. 16, 2017

(30) Foreign Application Priority Data
Nov. 27, 2014 (CN) .......................... 2014 1 0697616

(51) Int. Cl.
*G01B 11/26* (2006.01)
*G03F 9/00* (2006.01)
(Continued)

(52) U.S. Cl.
CPC .......... *G03F 9/7026* (2013.01); *G02B 7/305* (2013.01); *G02B 26/0816* (2013.01);
(Continued)

(58) Field of Classification Search
CPC ... G03F 9/7026; G02B 27/0075; G01B 11/26; G01C 1/00
(Continued)

(56) References Cited

U.S. PATENT DOCUMENTS

| 4,558,949 A | 12/1985 | Uehara et al. |
| 4,968,122 A * | 11/1990 | Hlousek ................ G01J 3/06 356/308 |
| 4,989,965 A * | 2/1991 | Bryan ................... G02B 7/00 359/871 |

FOREIGN PATENT DOCUMENTS

| CN | 101083423 A | 12/2007 |
| CN | 102267011 A | 12/2011 |

(Continued)

*Primary Examiner* — Roy M Punnoose
(74) *Attorney, Agent, or Firm* — Muncy, Geissler, Olds & Lowe, P.C.

(57) ABSTRACT

An amplitude monitoring system, a focusing and leveling apparatus and a defocus detection method. The method includes: adjusting amplitude of a scanning mirror to a theoretical amplitude value and recording corresponding theoretical output voltage values of a photodetector; adjusting the amplitude of the scanning mirror and sampling real-time amplitude values of the scanning mirror and real-time output voltage values of the photodetector to calculate compensated real-time demodulation results, and recording real-time defocus amounts of a wafer table; subsequent to stepwise displacement of the wafer table, establishing a database based on the compensated real-time demodulation results and the real-time defocus amounts of the wafer table; and in an actual measurement, sampling in real time an actual amplitude value of the scanning mirror and actual output voltage values of the photodetector to calculate a compensated real-time demodulation result and finding an actual defocus amount of the wafer table.

10 Claims, 5 Drawing Sheets

(51) Int. Cl.
*G02B 27/00* (2006.01)
*G03F 7/20* (2006.01)
*G02B 7/30* (2006.01)
*G02B 26/08* (2006.01)
*G02B 26/10* (2006.01)
*G02B 5/18* (2006.01)

(52) U.S. Cl.
CPC ....... *G02B 26/106* (2013.01); *G02B 27/0075* (2013.01); *G03F 7/70641* (2013.01); *G03F 9/7034* (2013.01); *G02B 5/1861* (2013.01); *G03F 2007/2067* (2013.01)

(58) Field of Classification Search
USPC .......................................................... 356/138
See application file for complete search history.

(56) References Cited

FOREIGN PATENT DOCUMENTS

| | | |
|---|---|---|
| CN | 102298278 A | 12/2011 |
| CN | 102768469 A | 11/2012 |
| JP | H08111361 A | 4/1996 |

\* cited by examiner

AMPLITUDE MONITORING SYSTEM, FOCUSING AND LEVELING DEVICE, AND DEFOCUSING AMOUNT DETECTION METHOD

TECHNICAL FIELD

The present invention relates to the field of optical detection technology and, in particular, to an amplitude monitoring system, a focusing and leveling apparatus and a defocus detection method.

BACKGROUND

A projection photolithography tool is a device that projects an image of a mask pattern onto a wafer by means of a projection objective. In order to form a projection image with relatively high accuracy on the wafer, it is necessary to accurately bring the wafer to a specified exposure position using an automatic focusing and leveling apparatus.

U.S. Pat. No. 4,558,949 describes a detection device for focusing and leveling, as shown in FIG. 1. This detection device includes: an illumination unit 101, a projection slit 102, a first planar reflector 103, a second planar reflector 105, a scanning mirror 106, a detection slit 107 and a photodetector 108. Light emitted from the illumination unit 101 passes through the projection slit 102 and is then reflected by the first planar reflector 103 onto a wafer surface 104, forming thereon a projection spot. The wafer surface 104 reflects the light onto the second planar reflector 105 which, in turn, reflects the light to the scanning mirror 106. The scanning mirror 106 modulates the light signal by periodically oscillating in a simple harmonic motion in order to increase its signal-to-noise ratio (SNR). The light from the scanning mirror 106 passes through the detection slit 107 and is incident on the photodetector 108 which then produces a voltage signal corresponding to the intensity of the received light. Under the effect of the modulation by the scanning mirror 106, the signal output from the photodetector 108 is eventually a periodically varying dynamic voltage signal. Finally, the dynamic voltage signal combined with a feedback square wave from the scanning mirror is analyzed and processed to detect defocus of the wafer surface 104. As a modulation reference for the focusing and leveling system, the scanning mirror needs to operate for a long time and are hence susceptible to the impact of temperature, pressure, humidity and other factors, which may impair its operational stability and thus degrade the wafer surface defocus detection accuracy of the detection device.

FIG. 2 shows demodulation result vs. defocus profiles at ideal and actual amplitude values. The profiles shown in FIG. 2 are obtained from a phase difference detection method. As apparent from the figure, amplitude stability of the scanning mirror has a great impact on the defocus detection. Therefore, this method suffers from certain limitations.

Persons skilled in this art have been looking for a solution for increasing wafer surface defocus measurement accuracy for such a detection device.

SUMMARY OF THE INVENTION

It is an object of the present invention to address the problem of low wafer surface defocus measurement accuracy due to degraded scanning mirror stability after long-time operation arising from use of the conventional detection device by presenting an amplitude monitoring system, a focusing and leveling apparatus and a defocus detection method.

To this end, the present invention provides an amplitude monitoring system comprising a scanning mirror and a control module for driving the scanning mirror to perform a simple harmonic motion. The scanning mirror is provided with a grating scale for measuring an oscillation angle of the scanning mirror in real time.

Optionally, in the amplitude monitoring system, the grating scale may comprise a grating and a grating reading head for use with the grating.

Optionally, in the amplitude monitoring system, the grating may be engraved in an oscillation shaft of the scanning mirror.

Optionally, in the amplitude monitoring system, the control module may drive the scanning mirror to oscillate at a fixed frequency via a drive line, and the grating reading head may be configured to read the oscillation angle of the scanning mirror in real time and then feed it back to the control module via a feedback line.

The present invention also provides a focusing and leveling apparatus for detecting a defocus amount of a wafer table, comprising: a light source, an illumination unit, a projection slit, a front lens group, a rear lens group, an amplitude monitoring system as defined above, a detection slit and a photodetector, wherein the scanning mirror in the amplitude monitoring system is configured to modulate a light signal by periodically oscillating in a simple harmonic motion.

The present invention also provides a defocus detection method using the defocus detection method as defined above, in which the light signal modulated by the scanning mirror is received by the photodetector and is subjected to demodulation and demodulation compensation carried out by a signal processor, comprising the steps of:

1) adjusting an amplitude of the scanning mirror to a theoretical amplitude value $\theta 0$ and recording corresponding theoretical output voltage values of the photodetector;

2) adjusting the amplitude of the scanning mirror for a plurality of times and sampling a plurality of real-time amplitude values $\theta i$ of the scanning mirror and a plurality of real-time output voltage values of the photodetector to calculate a plurality of compensated real-time demodulation results $S i$, displacing the wafer table stepwise and recording a plurality of real-time defocus amounts $H i$ of the wafer table, wherein i is a natural number in the range from 1 to N;

3) after displacing the wafer table, establishing a database based on the plurality of compensated real-time demodulation results $S i$ and the plurality of real-time defocus amounts $H i$ of the wafer table; and 4) in an actual measurement, sampling in real time an actual amplitude value $\theta k$ of the scanning mirror and actual output voltage values of the photodetector to calculate a compensated real-time demodulation result $S k$, and finding an actual defocus amount $H k$ of the wafer table by searching the database, wherein k is a natural number in the range from 1 to N.

Optionally, in the defocus detection method, in step 2), prior to displacing the wafer table, the wafer table may be moved to a positive defocus limit position or a negative defocus limit position.

Optionally, in the defocus detection method, in step 3), the database may be established based on the compensated real-time demodulation results selected from the plurality of compensated real-time demodulation results and the real-time defocus amounts selected from the plurality of real-time defocus amounts Hi, that define a linear relationship.

Optionally, in the defocus detection method, in step 4), the database may be searched using a linear interpolation method.

Optionally, in the defocus detection method, each amplitude value θ of the scanning mirror may be obtained from sampled oscillation angles α and β of the scanning mirror according to θ=|α−β|/2, where the oscillation angles α and β correspond to a rising edge and a falling edge of a feedback square wave of the scanning mirror, respectively, and the corresponding output voltage values of the photodetector may include voltage values A and B corresponding to the rising edge and the falling edge of the feedback square wave of the scanning mirror, respectively.

Optionally, in the defocus detection method, in step 2), adjusting the amplitude of the scanning mirror for the plurality of times and sampling the plurality of real-time amplitude values θi of the scanning mirror and the plurality of real-time output voltage values Ai and Bi of the photodetector to calculate the plurality of compensated real-time demodulation results Si may comprise:

monotonically changing the amplitude of the scanning mirror from a lower limit to an upper limit, with the theoretical amplitude value θ0 as a middle point, and after the each change sampling a current real-time amplitude value θi of the scanning mirror and a current real-time voltage values Ai and Bi output from the photodetector;

calculating Mi=θi/θ0 and Ni=(Ai+Bi)/(A0+B0), and fitting Mi as an independent variable to Ni as a dependent variable to obtain a polynomial Ni=f(Mi), wherein A0 and B0 are theoretical voltage values output from the photodetector; and calculating the compensated real-time demodulation result Si according to Si=(Ai−Bi)*f(θi/θ0)/(Ai+Bi), based on θi, Ai, Bi, θ0, A0, B0 and coefficient of the polynomial.

In the amplitude monitoring system, the focusing and leveling apparatus and the defocus detection method, according to the present invention, amplitude of the scanning mirror is adjusted, and real-time amplitude values of the scanning mirror and real-time output voltage values of the photodetector are sampled. Compensated real-time demodulation results Si are then calculated, and real-time defocus amounts Hi of the wafer table are recorded. A database is then established based on the compensated real-time demodulation results Si and the real-time defocus amounts Hi of the wafer table. In an actual measurement, an actual amplitude value of the scanning mirror and actual output voltage values of the photodetector are sampled in real time, for calculation of a compensated actual demodulation result Sk. A linear interpolation method is used to search the database to obtain an actual defocus amount Hk of the wafer table. This avoids low accuracy of the wafer surface defocus measurement of the focusing and leveling apparatus due to degraded stability of the scanning mirror caused by long-time operation.

DETAILED DESCRIPTION

The amplitude monitoring system, focusing and leveling apparatus and defocus detection method according to the present invention will be described below in greater detail with reference to the accompanying drawings and specific embodiments. Features and advantages of the invention will be more apparent from the following detailed description, as well as from the appended claims. It is noted that the accompanying drawings are provided in a very simplified form not necessarily presented to scale, with the only purpose of facilitating convenience and clarity in explaining the embodiments.

Figure 1:
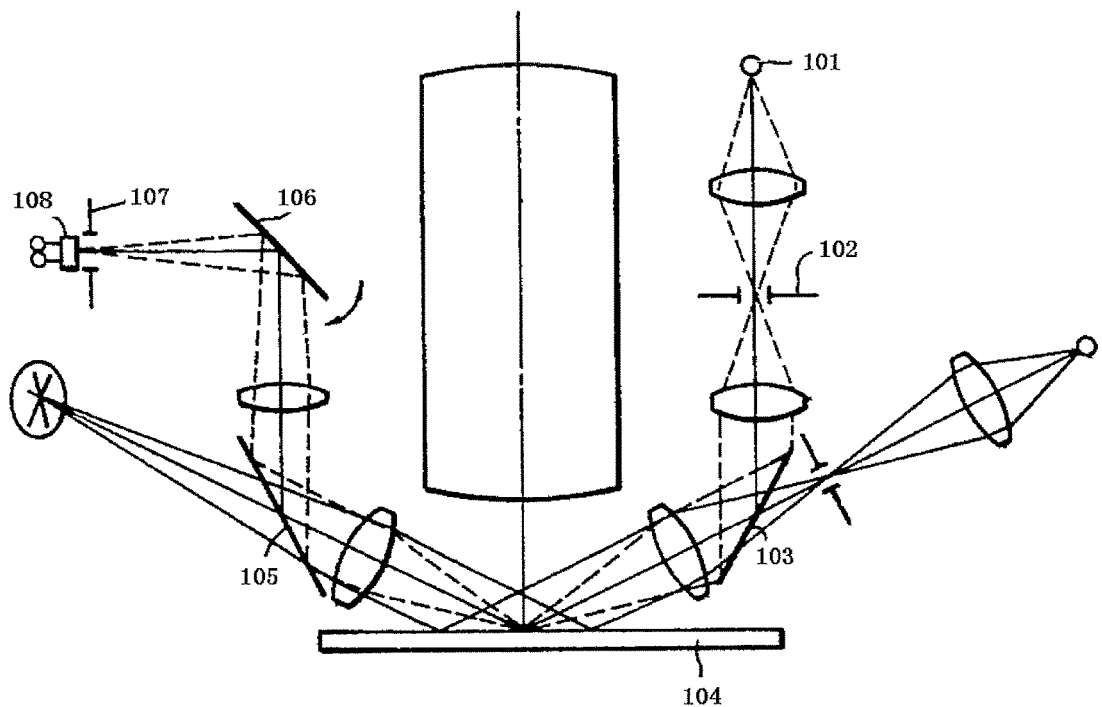
FIG. 1 shows a detection device for focusing and leveling described in U.S. Pat. No. 4,558,949.
Figure 2:
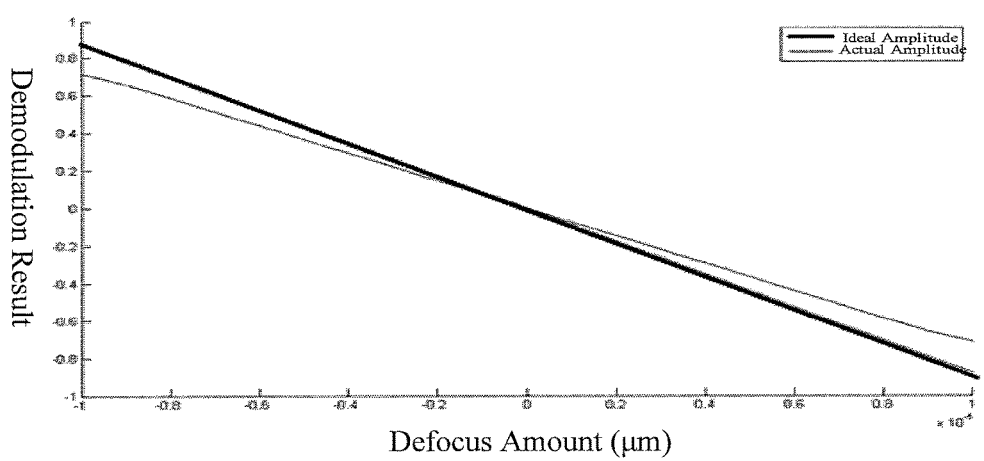
FIG. 2 shows demodulation result vs. defocus profiles at ideal and actual amplitude values of a scanning mirror.
Figure 3:
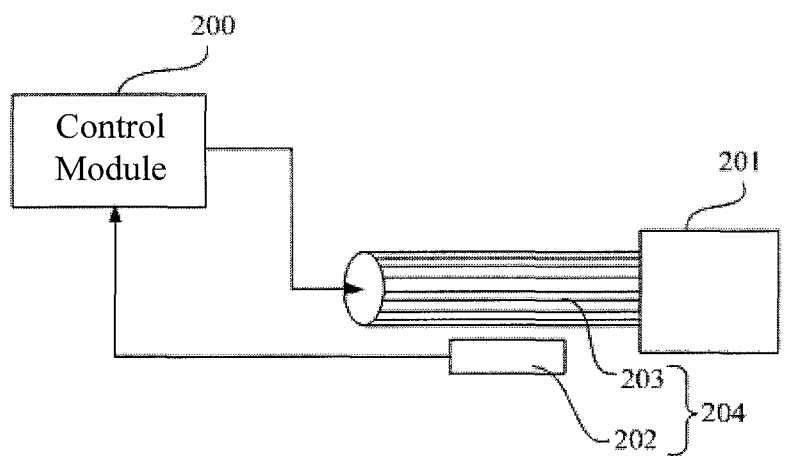
FIG. 3 is a structural schematic of an amplitude monitoring system.

FIG. 3 is a structural schematic of an amplitude monitoring system according to the present invention. As shown in the figure, the amplitude monitoring system comprises a scanning mirror 201 and a control module 200 for driving the scanning mirror 201 to perform a simple harmonic motion. The scanning mirror 201 is provided with a grating scale 204 configured to measure a real-time oscillation angle of the scanning mirror.

In the present embodiment, the grating scale 204 includes a grating 203 and a grating reading head 202 for use with the grating 203. The grating 203 is engraved in an oscillation shaft of the scanning mirror 201. The control module 200 drives the scanning mirror 201 to oscillate at a fixed frequency via a drive line. The grating reading head 202 is configured to read the real-time oscillation angle of the scanning mirror 201 and then feed it back to the control module 200 via a feedback line.

Alternatively, in addition to the field of semiconductor device fabrication, the scanning mirror may also be applicable to other fields where optical detection devices need to use a scanning mirror.

Figure 10:
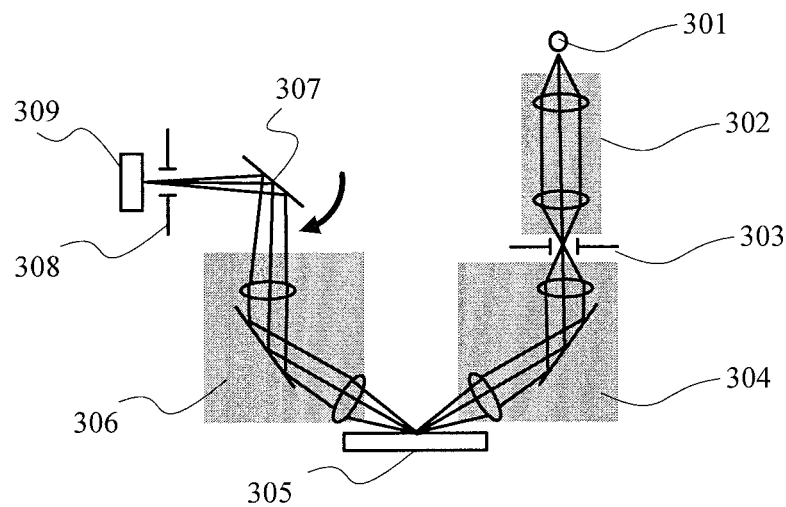
FIG. 10 is a schematic illustration of a focusing and leveling apparatus in accordance with an embodiment of the present invention.

In this embodiment, there is also provided a focusing and leveling apparatus, as shown in FIG. 10, for detecting a defocus amount of a wafer table 305. The focusing and leveling apparatus comprises, essentially, a light source 301, an illumination unit 302, a projection slit 303, a front lens group 304, a rear lens group 306, the amplitude monitoring system 307 as defined above (only the scanning mirror in the amplitude monitoring system is schematically illustrated in the figure), a detection slit 308 and a photodetector 309. With combined reference to FIG. 3, the scanning mirror 201 in the amplitude monitoring system 307 modulates a light signal by periodically oscillating in a simple harmonic motion.

Figure 6:
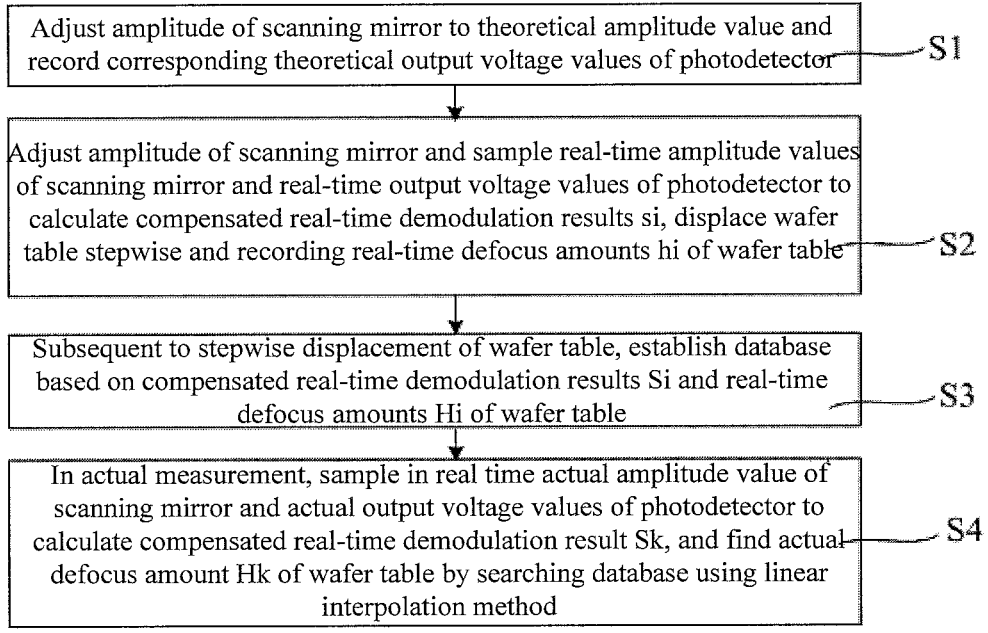
FIG. 6 is a flowchart illustrating a defocus detection method in accordance with an embodiment of the present invention.

Accordingly, there is also provided in this embodiment a defocus detection method employing the above focusing and leveling apparatus. The light signal modulated by the scanning mirror 201 is received by the photodetector and is then subjected to demodulation and demodulation compensation carried out by a signal processor. Reference is now made to FIG. 6, a flowchart illustrating a defocus detection method in accordance with an embodiment of the present invention. As shown in FIG. 6, the defocus detection method specifically includes the steps as described below.

At first, in step S1, amplitude of the scanning mirror is adjusted to a theoretical value, and corresponding theoretical output voltage values of the photodetector are recorded.

Subsequently, in step S2, amplitude of the scanning mirror is modified, and real-time amplitude values of the scanning mirror and real-time output voltage values of the photodetector are sampled and used to calculate compensated real-time demodulation results $S_i$. Afterward, the wafer table is displaced stepwise, and real-time defocus amounts $H_i$ of the wafer table are recorded. Wherein, prior to the stepwise displacement of the wafer table, it is moved to a positive defocus limit position or a negative defocus limit position. By the stepwise displacement, the wafer table is moved to positions between the positive defocus limit position and the negative defocus limit position.

In this embodiment, each amplitude value $\theta$ of the scanning mirror is obtained from corresponding sampled oscillation angles $\alpha$ and $\beta$ thereof according to $\theta=|\alpha-\beta|/2$, where $\alpha$ and $\beta$ correspond respectively to oscillation angles of a rising edge and a falling edge of a feedback square wave of the scanning mirror. The output voltage values of the photodetector include value A and B corresponding respectively to the rising and falling edges of the feedback square wave.

Figure 5:
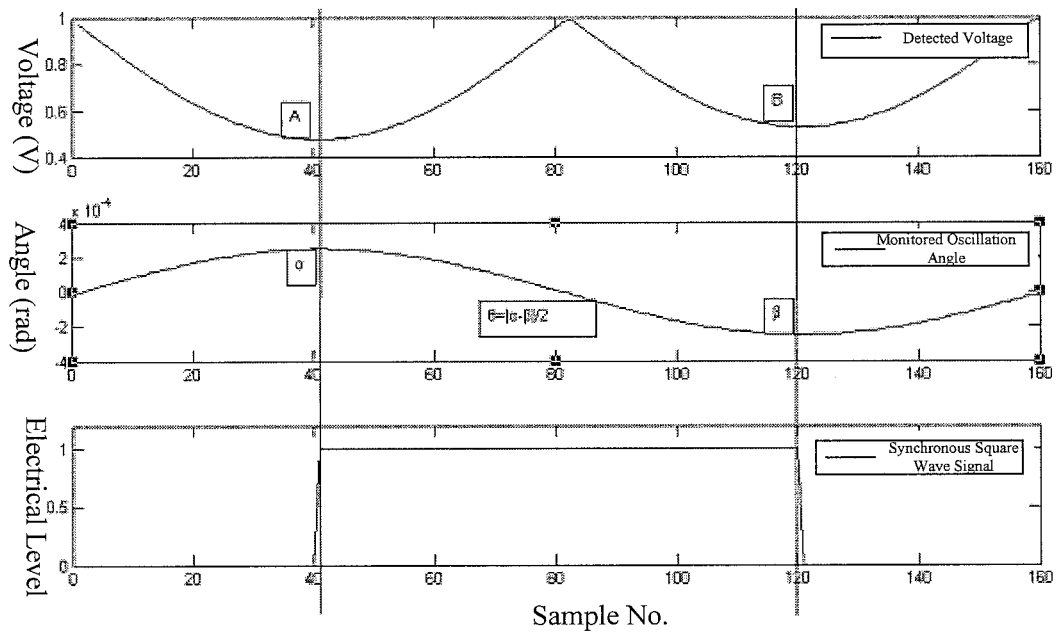
FIG. 5 is a diagram showing a simulated relationship between a feedback square wave of the scanning mirror, real-time output voltage values of a photodetector and real-time amplitude values θi of the scanning mirror.

FIG. 5 is a diagram showing a simulated relationship between the feedback square wave of the scanning mirror, real-time output voltage values of the photodetector and real-time amplitude values $\theta_i$ of the scanning mirror. Here, the feedback square wave is a synchronous square wave. The real-time output voltage values of the photodetector are indicated by $A_i$ and $B_i$ and correspond to rising and falling edges of the feedback square wave at an amplitude of the scanning mirror of $\theta_i$, where $\theta_i=|\alpha_i-\beta_i|/2$. FIG. 5 shows only one cycle of the feedback square wave of the scanning mirror.

Figure 7:
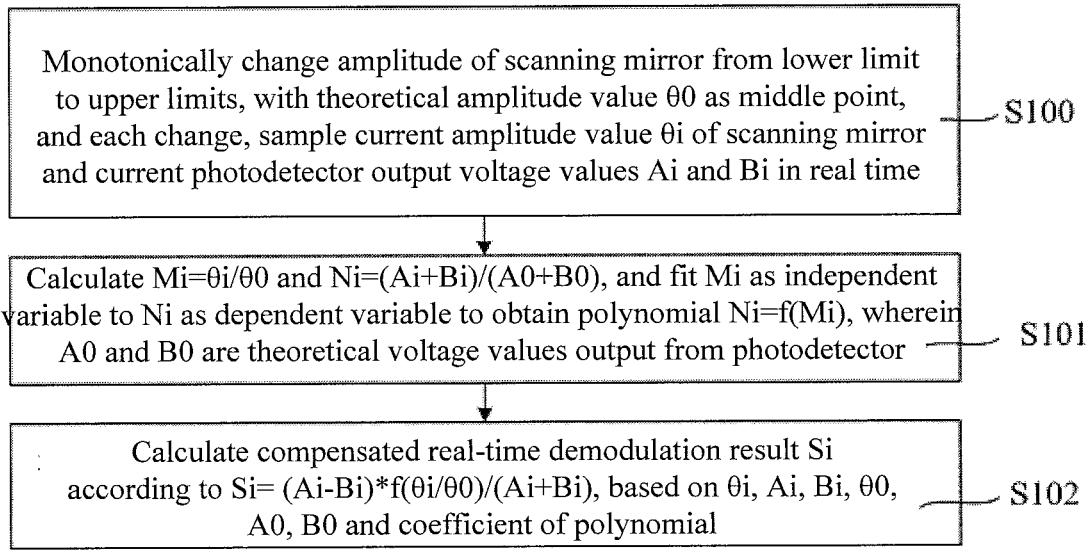
FIG. 7 is a flowchart illustrating a process for calculating a compensated real-time demodulation result Si using a focusing and leveling apparatus.

With continued reference to FIG. 5 and further to FIG. 7, where FIG. 7 is a flowchart showing a process of calculating the compensated real-time demodulation results $S_i$ using the focusing and leveling apparatus (i.e., step S2 of FIG. 6). As shown in FIG. 7, the process of adjusting amplitude of the scanning mirror, sampling real-time values of the amplitude of the scanning mirror and real-time output voltages of the photodetector, and calculating the compensated real-time demodulation results $S_i$ includes the steps as described below.

First of all, in step S100, the amplitude of the scanning mirror is changed stepwise from a lower limit to an upper limit, with the theoretical amplitude $\theta_0$ as a middle point. In each step, the current amplitude value $\theta_i$ of the scanning mirror and current photodetector output voltage values $A_i$ and $B_i$ are sampled in real time.

After that, in step S101, $M_i$ is calculated according to $M_i=\theta_i/\theta_0$ and $N_i$ is calculated according to $N_i=(A_i+B_i)/(A_0+B_0)$, and $M_i$ as an independent variable is fitted to $N_i$ as a dependent variable to obtain a polynomial $N_i=f(M_i)$, where $A_0$ and $B_0$ are theoretical photodetector output voltage values corresponding respectively to rising and falling edges of the feedback square wave of the scanning mirror at the amplitude value of $\theta_0$.

Afterward, in step S102, based on $\theta_i$, $A_i$, $B_i$, $\theta_0$, $A_0$, $B_0$ and the coefficient of the polynomial, the compensated real-time demodulation results $S_i$ are calculated as $(A_i-B_i)*f(\theta_i/\theta_0)/(A_i+B_i)$.

Thereafter, in step S3, subsequent to the stepwise displacements of the wafer table, a database is established based on selected compensated real-time demodulation results $S_i$ and real-time defocus amounts $H_i$ of the wafer table.

Preferably, the selected compensated real-time demodulation results $S_i$ and real-time defocus values $H_i$, based on which the database is established, define a linear relationship.

Figure 8:
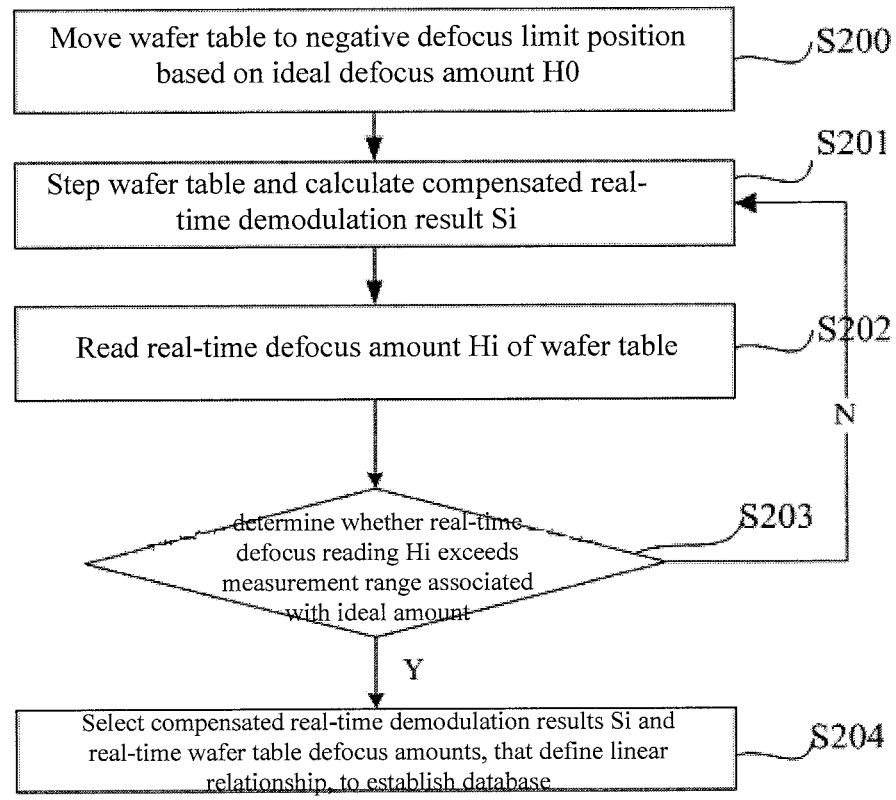
FIG. 8 is a flowchart illustrating a process for establishing a database.

Reference is now made to FIG. 8, a flowchart illustrating a process of establishing the database. As shown in FIG. 8, at first, in step S200, the wafer table is moved to the positive defocus limit position or the negative defocus limit position based on an ideal defocus amount $H_0$. After that, in step S201, the wafer table is stepped, and a compensated real-time demodulation result $S_i$ is calculated. Next, in step S202, a real-time defocus amount $H_i$ (i.e., a height value $H_i$) of the wafer table is read. Thereafter, in step S203, it is determined whether the real-time defocus reading $H_i$ has exceeded the measurement range associated with the ideal amount $H_0$ or not. If the determination is negative, then step S201 is repeated. If the determination is positive, then the control proceeds to step S204 in which compensated real-time demodulation results $S_i$ and real-time defocus amounts, that define a linear relationship, are selected to establish the database.

Subsequently, in step S4, an actual measurement is performed in which an actual amplitude value of the scanning mirror and actual output voltage values of the photodetector are sampled to calculate an actual compensated real-time demodulation result $S_k$, based on which, an actual defocus amount $H_k$ of the wafer table is found in the database using a linear interpolation method.

Figure 9:
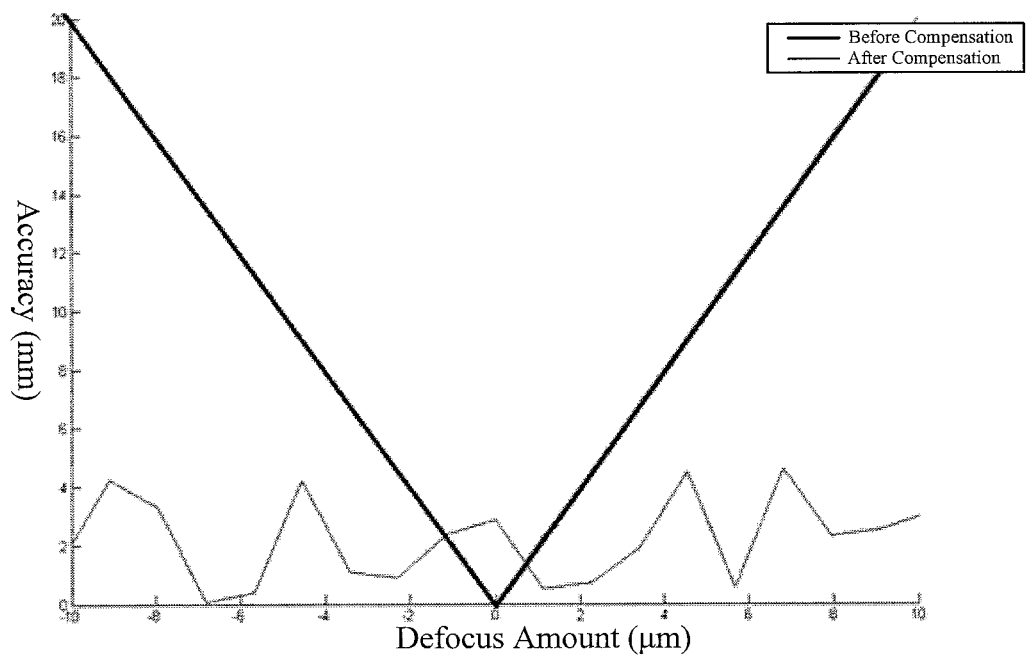
FIG. 9 is a diagram illustrating the results of a comparison between defocus accuracies obtained before and after the application of the defocus detection method.

Specifically, in the actual defocus measurement, the actual compensated real-time demodulation result $S_k$ is calculated based on the results from steps S100-S102, and the actual defocus amount $H_k$ is found in the established database using the linear interpolation method. As $H_k$ is obtained on the basis of the database established in step S3, an improvement in defocus measurement accuracy is achieved. Preferably, reference is now made to FIG. 9, a diagram illustrating the results of a comparison between defocus accuracies obtained before and after the application of the defocus detection method. As apparent from FIG. 9, variations in defocus accuracy are reduced, indicating a significant improvement in defocus detection accuracy resulting from use of the proposed defocus detection method.

Figure 4:
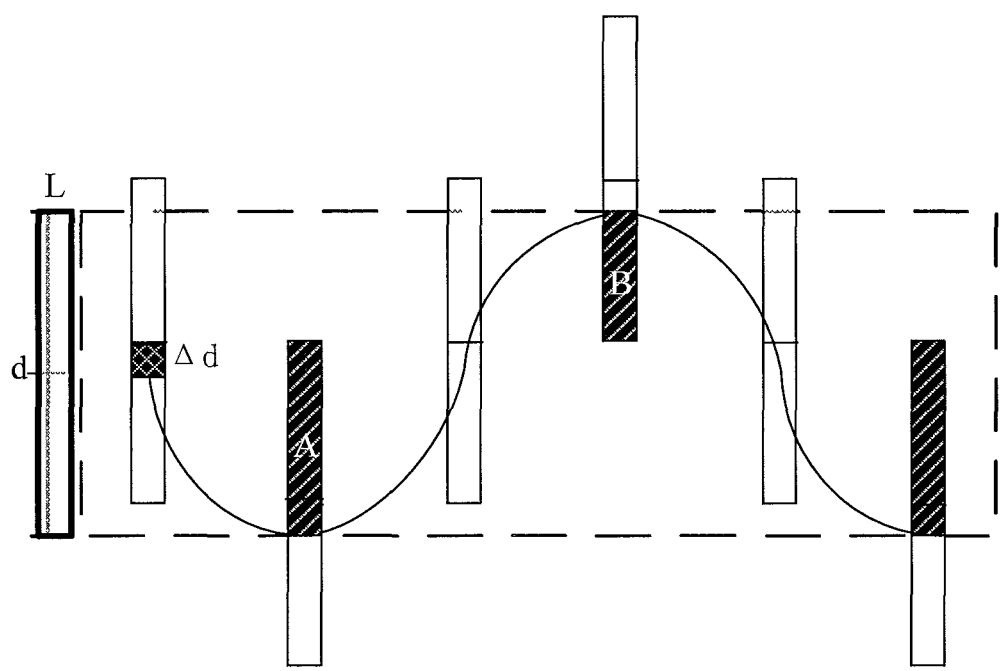
FIG. 4 is a diagram showing a relationship between a detection slit and light spots that have been modulated by the scanning mirror and are formed at different time instants.

In order to minimize the impact of scanning mirror amplitude instability on measurement accuracy, reference is now made to FIG. 4, a diagram showing a relationship between the detection slit and light spots modulated by the scanning mirror and formed at different time instants. As shown in FIG. 4, assuming the detection slit has a width of d and a length of L and a wafer defocus causes an offset $\Delta d$ of the projection spot relative to the detection slit, the projection spot modulated by the scanning mirror will vertically oscillate relative to the detection slit along the direction of the width d within the range of $\pm d/2$, and the positional relationship between the light spot and the detection slit at different time instants is schematically shown in the figure. In general, since the scanning mirror oscillates at a high frequency, in one oscillation cycle, assuming the position A corresponds to a value sampled at the rising edge of the feedback square wave and the position B corresponds to a value sampled at the falling edge of the feedback square wave, then oscillation angles of the scanning mirror at the positions A and B can be considered to have the same magnitude but opposite signs. Thus, variations in amplitude θ of the scanning mirror will have no impact on (A−B) but only on (A+B). In addition, a ratio Mi of the real-time amplitude value θi of the scanning mirror to its theoretical amplitude value θ0 is uniquely mapped to a ratio of the actual voltage value (Ai+Bi) to the theoretical voltage value (A0+B0). Therefore, a function between Mi and Ni, i.e., the fitted polynomial Ni=f(Mi), can be obtained in advance through real-time monitoring of the real-time amplitude θi of the scanning mirror. As such, in a subsequent self-calibrating measurement, an ideal voltage value (A+B) can be obtained from the polynomial Ni=f(Mi) based on the monitored real-time amplitude values θi of the scanning mirror and actually sampled real-time voltage values (Ai+Bi), thereby eliminating the impact of the scanning mirror amplitude instability on measurement accuracy.

In summary, in the amplitude monitoring system, the focusing and leveling apparatus and the defocus detection method, according to the present invention, amplitude of the scanning mirror is adjusted, and real-time amplitude values of the mirror and real-time output voltage values of the photodetector are sampled. Compensated real-time demodulation results Si are then calculated, and real-time defocus amounts Hi of the wafer table are recorded. A database is then established based on the compensated real-time demodulation results Si and the real-time defocus amounts Hi of the wafer table. In an actual measurement, an actual amplitude value of the scanning mirror and actual output voltage values of the photodetector are sampled in real time, for calculation of a compensated actual demodulation result Sk. A linear interpolation method is used to search the database to obtain an actual defocus amount Hk of the wafer table. This avoids low accuracy of the wafer surface defocus measurement of the focusing and leveling apparatus due to degraded stability of the scanning mirror caused by long-time operation.

The foregoing description presents merely a few preferred embodiments of the present invention and does not limit the scope thereof in any sense. All changes or modifications made in light of the above disclosure by any person of ordinary skill in the art fall within the scope of protection set forth in the appended claims.

What is claimed is:

1. An amplitude monitoring system comprising a scanning mirror; and, a control module for driving the scanning mirror to perform a simple harmonic motion, wherein the scanning mirror is provided with a grating scale for measuring an oscillation angle of the scanning mirror in real time, wherein the grating scale comprises a grating, which is engraved on an oscillation shaft of the scanning mirror.

2. The amplitude monitoring system according to claim 1, wherein the grating scale comprises a grating reading head for use with the grating.

3. The amplitude monitoring system according to claim 2, wherein the control module drives the scanning mirror to oscillate at a fixed frequency via a drive line, and wherein the grating reading head is configured to read the oscillation angle of the scanning mirror in real time and then feed the oscillation angle back to the control module via a feedback line.

4. A focusing and leveling apparatus for detecting a defocus amount of a wafer table, comprising a light source, an illumination unit, a projection slit, a front lens group, a rear lens group, an amplitude monitoring system as defined in claim 1, a detection slit and a photodetector, wherein the scanning mirror in the amplitude monitoring system is configured to modulate a light signal by periodically oscillating in a simple harmonic motion.

5. A defocus detection method using the focusing and leveling apparatus as defined in claim 4, in which the light signal modulated by the scanning mirror is received by the photodetector and is subjected to demodulation and demodulation compensation carried out by a signal processor, comprising the steps of:
   1) adjusting an amplitude of the scanning mirror to a theoretical amplitude value θ0 and recording corresponding theoretical voltage values output from the photodetector;
   2) adjusting the amplitude of the scanning mirror for a plurality of times and sampling a plurality of real-time amplitude values θi of the scanning mirror and a plurality of real-time voltage values output from the photodetector to calculate a plurality of compensated real-time demodulation results Si, displacing the wafer table stepwise and recording a plurality of real-time defocus amounts Hi of the wafer table, wherein i is a natural number in a range from 1 to N;
   3) after displacing the wafer table, establishing a database based on the plurality of compensated real-time demodulation results Si and the plurality of real-time defocus amounts Hi of the wafer table; and
   4) in an actual measurement, sampling in real time an actual amplitude value θk of the scanning mirror and actual voltage values output from the photodetector to calculate a compensated real-time demodulation result Sk, and finding an actual defocus amount Hk of the wafer table by searching the database, wherein k is a natural number in the range from 1 to N.

6. The defocus detection method according to claim 5, wherein in step 2), prior to displacing the wafer table, the wafer table is moved to a positive defocus limit position or a negative defocus limit position.

7. The defocus detection method according to claim 5, wherein in step 3), the database is established based on compensated real-time demodulation results selected from the plurality of compensated real-time demodulation results and real-time defocus amounts selected from the plurality of real-time defocus amounts Hi, that define a linear relationship.

8. The defocus detection method according to claim 5, wherein in step 4), the database is searched using a linear interpolation method.

9. The defocus detection method according to claim 5, wherein the amplitude value θi of the scanning mirror is obtained from sampled oscillation angles α and β of the scanning mirror according to θi=|α−β|/2, where the oscillation angles α and β correspond to a rising edge and a falling edge of a feedback square wave of the scanning mirror, respectively, and wherein the voltage values output from the photodetector include voltage values Ai and Bi corresponding to the rising edge and the falling edge of the feedback square wave of the scanning mirror, respectively.

10. The defocus detection method according to claim 9, wherein in step 2), adjusting the amplitude of the scanning mirror for the plurality of times and sampling the plurality of real-time amplitude values $\theta i$ of the scanning mirror and the plurality of real-time voltage values $Ai$ and $Bi$ output from the photodetector to calculate the plurality of compensated real-time demodulation results $Si$ comprises:

monotonically changing the amplitude of the scanning mirror from a lower limit to an upper limit, with the theoretical amplitude value $\theta 0$ as a middle point, and after each change, sampling a current real-time amplitude value $\theta i$ of the scanning mirror and a current real-time voltage values $Ai$ and $Bi$ output from the photodetector;

calculating $Mi=\theta i/\theta 0$ and $Ni=(Ai+Bi)/(A0+B0)$, and fitting $Mi$ as an independent variable to $Ni$ as a dependent variable to obtain a polynomial $Ni=f(Mi)$, wherein $A0$ and $B0$ are theoretical voltage values output from the photodetector; and calculating the compensated real-time demodulation result $Si$ according to $Si=(Ai-B0*f(\theta i/\theta 0)/(Ai+Bi)$, based on $\theta i$, $Ai$, $Bi$, $\theta 0$, $A0$, $B0$ and coefficient of the polynomial.

\* \* \* \* \*